United States Patent
Oikawa

[11] Patent Number: 5,214,431
[45] Date of Patent: May 25, 1993

[54] DELTA SIGMA MODULATOR
[75] Inventor: Naoto Oikawa, Tokyo, Japan
[73] Assignee: NEC Corporation, Tokyo, Japan
[21] Appl. No.: 913,027
[22] Filed: Jul. 14, 1992
[30] Foreign Application Priority Data
 Jul. 15, 1991 [JP] Japan .................................. 3-172851
[51] Int. Cl.[5] ..................... H03M 3/00; H03M 1/34
[52] U.S. Cl. ................................... 341/143; 341/158
[58] Field of Search ............... 341/143, 148, 155, 126, 341/110, 158; 307/291, 279, 272.2

[56] References Cited
 U.S. PATENT DOCUMENTS

| | | | |
|---|---|---|---|
| 4,156,871 | 5/1979 | Lambourn | 341/143 |
| 4,374,331 | 2/1983 | Yamamoto et al. | 307/291 |
| 4,691,122 | 9/1987 | Schnizlein et al. | 307/279 |
| 4,768,018 | 8/1988 | Noujaim | 341/143 |
| 4,777,472 | 10/1988 | Sauer et al. | 341/143 |
| 4,926,178 | 5/1990 | Mallinson | 341/143 |
| 4,970,407 | 11/1990 | Patchen | 307/291 X |
| 4,999,625 | 3/1991 | Thompson | 341/143 X |
| 5,021,786 | 6/1991 | Gerdes | 341/143 |

Primary Examiner—Sharon D. Logan
Attorney, Agent, or Firm—Leydig, Voit & Mayer

[57] ABSTRACT

A data latch circuit of a delta sigma modulator is controlled in timing of data output by clock signal. For this purpose, the data latch circuit has a reverse phase clock input terminal connected to a first delay circuit and a forward phase clock input terminal connected to a second delay circuit. The latch circuit is composed of two P-MOS transistors and two N-MOS transistors. The delay times of the first and second delay circuits are coincided, and those of the respective two P- and N-MOS transistors are also coincided.

14 Claims, 3 Drawing Sheets

DELTA SIGMA MODULATOR

FIELD OF THE INVENTION

This invention relates to a delta sigma modulator, and more particularly to, a delta sigma modulator having a digital to analog converter built therein.

BACKGROUND OF THE INVENTION

A conventional delta sigma modulator comprises an operational amplifier, a voltage comparator, and a D type flip flop. The operational amplifier has a positive (non-inverted) input connected to a first reference voltage source, a negative (inverted) input connected through a first resistor to a signal input terminal, and an output to be fed back through a capacitor to the negative input. The voltage comparator has a positive input connected to the output of the operational amplifier, a negative input connected to a second reference voltage source, and an output connected to a signal output terminal and an input of the D type flip flop. The D type flip flop is applied with positive and negative power supply voltages, and supplied with a clock signal, such that an output signal is generated in accordance with an output signal supplied from the voltage comparator, and is supplied through a second resistor to the negative input of the operational amplifier.

In operation, input voltages applied to the positive and negative inputs of the operational amplifier becomes equal, because negative feedback is carried out in the operational amplifier by the capacitor. Here, when a signal voltage $V_{IN}$ is applied to the signal input terminal, the capacitor is charged and discharged by the sum of currents calculated by "$(V_{IN}-V_{R1})/R_{21}$" and "$(V_D-V_{R1})/R_{22}$", where $R_{21}$ and $R_{22}$ are resistance values of the first and second resistors, $V_{R1}$ is a voltage of the first reference voltage, and $V_D$ is an output signal voltage of the D type flip flop. An output voltage of the operational amplifier is converted to binary data by the voltage comparator, and the binary data is supplied to the D type flip flop, in which one bit data is generated in accordance with the sampling of the binary data by the clock signal, and the one bit data is one sample clock-delayed and is inverted to provide an inverted one bit data. The inverted one bit data is converted to an analog data which is fed back through the second resistor to the negative input of the operational amplifier. If it is assumed that P- and N-MOS transistors of the D type flip flop connected at drains to the output thereof have ON resistance values negligible for a resistance value of the second resistor, a voltage of the signal output terminal becomes the positive power supply voltage $V_{DD}$ or the negative power supply voltage $V_{SS}$. If it is assumed that first reference power supply voltage $V_{R1}$ is half a value obtained by subtracting $V_{SS}$ from $V_{DD}[V_{R1}=\frac{1}{2}(V_{DD}-V_{SS})]$, a voltage at the negative input of the operational amplifier is also half the value obtained by subtraction, and a current flowing through the second resistor becomes the D/A converted output of one bit by the direction thereof. In accordance with the above described delta sigma modulator, a signal (quantized noise) supplied to the voltage comparator becomes a negative feedback signal at a low frequency band, and a positive feedback signal at a high frequency band.

According to the conventional delta sigma modulator, however, there is a disadvantage in that a distortion factor becomes deteriorated. The distortion factor is affected dependent on a value DF defined by the equation (1).

$$DF=|tpdr-tp-df+\tfrac{1}{2}(tr-tf)| \quad (1)$$

where tpdr and tpdf are propagation delay times at data rising and falling times, and tr and tf are data rising and falling times in the D type flip flop for constituting a D/A converter, as described on pages 153 to 166 of "J. Audio Eng. Soc., Vol. 34".

As apparent from the equation (1), the distortion factor can be minimized by decreasing the value DF in accordance with the setting up of the relation "tpdr=tpdf" and "tr=tf". In the conventional delta sigma modulator, however, the signal transfer paths are different between the data rising and falling times, so that the relation "tpdr=tpdf" is not met. The detail of structure, operation, disadvantage, etc. of the conventional delta sigma modulator will be explained in more detail just prior to the description of preferred embodiments according to the invention.

SUMMARY OF THE INVENTION

Accordingly, it is an object of the invention to provide a delta sigma modulator in which a distortion factor can be decreased.

According to the invention, a delta sigma modulator, comprises:

an adder for adding an input signal and a signal which is fed back in accordance with the input signal;

an integration circuit for integrating an output signal of the adder;

a comparator circuit for comparing an output signal of the integration circuit and a reference signal;

a first latch circuit having data input and output terminals and forward and reverse phase clock input terminals;

a second latch circuit having data input and output terminals and forward and reverse phase clock input terminals;

first to third inverters; and first to fourth delay circuits; wherein:

an output of the adder is connected to an input of the integration circuit; an output of the integration circuit is connected to the comparator circuit; an output of the comparator circuit is connected to a signal output terminal and the data input terminal of the first latch circuit; the data output terminal of the first latch circuit is connected to the data input terminal of the second latch circuit; the data output terminal of the second latch circuit is connected to an input of the first inverter; an output of the first inverter is connected to an input of the adder; an input of the second inverter is connected to a clock input terminal and an output thereof is connected to inputs of the third inverter and the third and fourth delay circuits; an output of the third inverter is connected to inputs of the first and second delay circuits; an inverted output of the first delay circuit is connected to the reverse phase clock input terminal of the second latch circuit; an output of the second delay circuit is connected to the forward phase clock input terminal of the second latch circuit; an inverted output of the third delay circuit is connected to the reverse phase clock input terminal of the first latch circuit; and an output of the fourth delay circuit is connected to the forward phase clock input terminal of the first latch circuit.

BRIEF DESCRIPTION OF THE DRAWINGS

The invention will be explained in more detail in conjunction with appended drawings; wherein.

DESCRIPTION OF THE PREFERRED EMBODIMENTS

Figure 1:
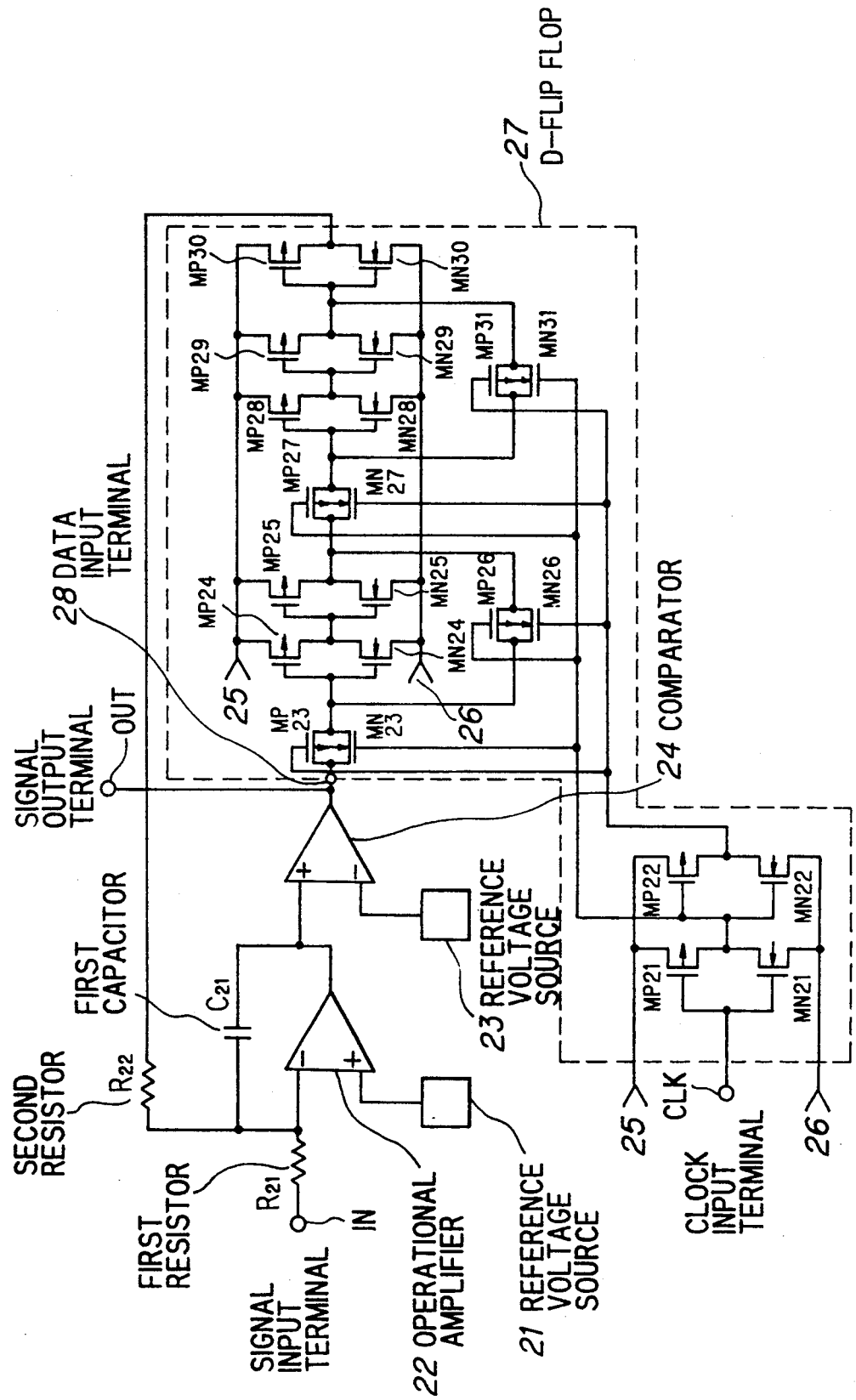
FIG. 1 is a circuit diagram showing a conventional delta sigma modulator.

Before explaining a delta sigma modulator of a first preferred embodiment according to the invention, the aforementioned conventional delta sigma modulator will be explained in FIG. 1.

The conventional delta sigma modulator comprises an operational amplifier 22, a voltage comparator 24, and a D type flip flop 27. The operational amplifier 22 is connected at a positive input to a first reference voltage power supply 21, at a negative input via a first resistor $R_{21}$ to a signal input terminal IN and at an output via a capacitor $C_{21}$ to the negative input. The voltage comparator 24 is connected at a positive input to the output of the operational amplifier 22, at a negative input to a second reference voltage power supply 23, at an output to a signal output terminal OUT and an input of the D type flip flop 27. The D type flip flop 27 is applied with positive and negative voltages by positive and negative power supplies 25 and 26, and supplied with a clock signal at a clock input terminal CLK, and an output thereof is connected via a second resistor $R_{22}$ to the negative input of the operational amplifier 22.

In the D type flip flop 27, a P-MOS transistor MP21 is connected at source to the positive power supply 25, and at gate to the clock input terminal CLK, and an N-MOS transistor MN21 is connected at source to the negative power supply 26, at gate to the clock input terminal CLK, and at drain to drain of the P-MOS transistor MP21, a P-MOS transistor MP22 is connected at source to the positive power supply 25, and at gate to drain of the P-MOS transistor MP21, an N-MOS transistor MN22 is connected at source to the negative power supply 26, at gate to drain of the P-MOS transistor MP21, and at drain to drain of the P-MOS transistor MP22, a P-MOS transistor MP23 is connected at source to the output of the voltage comparator 24 and a data input terminal 28, and at gate to drain of the P-MOS transistor MP22, an N-MOS transistor MN23 is connected at source to source of the P-MOS transistor MP23, at gate to drain of the P-MOS transistor MP21, and at drain to drain of the P-MOS transistor MP23, a P-MOS transistor MP24 is connected at source to the positive power supply 25, and at gate to drain of the P-MOS transistor MP23, an N-MOS transistor MN24 is connected at source to the negative power supply 26, at gate to drain of the P-MOS transistor MP23, and at drain to drain of the P-MOS transistor MP24, a P-MOS transistor MP25 is connected at source to the positive power supply 25, and at gate to drain of the P-MOS transistor MP24, an N-MOS transistor MN25 is connected at source to the negative power supply 25, at gate to the P-MOS transistor MP24, and at drain to drain of the P-MOS transistor MP25, a P-MOS transistor MP26 is connected at source to drain of the P-MOS transistor MP25, at gate to drain of the P-MOS transistor MP21, and at drain to gate of the P-MOS transistor MP24, an N-MOS transistor MN26 is connected at source to drain of the P-MOS transistor MP25, at gate to drain of the P-MOS transistor MP22, and a drain to gate of the P-MOS transistor MP24, a P-MOS transistor MP27 is connected at source to drain of the P-MOS transistor MP25, and at gate to drain of the P-MOS transistor MP21, an N-MOS transistor MN27 is connected at source to drain of the P-MOS transistor MP25, at gate to drain of the P-MOS transistor MP22, and at drain to drain of the P-MOS transistor MP27, a P-MOS transistor MP28 is connected at source to the positive power supply 25, and at gate to drain of the P-MOS transistor MP27, an N-MOS transistor MN28 is connected at source to the negative power supply 26, at gate to drain of the P-MOS transistor MP27, and at drain to drain of the P-MOS transistor MP27, a P-MOS transistor MP29 is connected at source to the positive power supply 25, and at gate to drain of the P-MOS transistor MP28, an N-MOS transistor MN29 is connected at source to the positive power supply 25, at gate to drain of the P-MOS transistor MP28, and at drain to drain of the P-MOS transistor MP29, a P-MOS transistor MP30 is connected at source to the positive power supply 25, and at gate to drain of the P-MOS transistor MP29, an N-MOS transistor MN30 is connected at source to the negative power supply 26, at gate to drain of the P-MOS transistor MP29, and at drain to drain of the P-MOS transistor MP30, a P-MOS transistor MF31 is connected at source to drain of the P-MOS transistor MP29, at gate to drain of the P-MOS transistor MP22, and at drain to gate of the P-MOS transistor MP28, and an N-MOS transistor MN31 is connected at source to drain of the P-MOS transistor MP29, at gate to drain of the P-MOS transistor MP21, and at drain to gate of the P-MOS transistor MP28.

Operation of the conventional delta sigma modulator was explained before, so that it is omitted here.

As explained before, it is not realized that the value DF defined by the equation (1) becomes zero.

Here, the distortion factor will be again discussed below. Here, it is assumed that data delay times of the MOS transistors MN21, MP22, MP27, MN27, MP28, MN28, MP29, MN29, MP30 and MN30 are $\tau N21$, $\tau P22$, $\tau P27$, $\tau N27$, $\tau P28$, $\tau N28$, $\tau P29$, $\tau N29$, $\tau P30$ and $\tau N30$, so that equations (2) and (3) are obtained.

$$tpdr = \tau N21 + \tau P22 + \tau N27 + P28 + \tau N29 + \tau P30 \quad (2)$$

$$tpdf = \tau N21 + \tau P27 + \tau N28 + \tau P29 + \tau N30 \quad (3)$$

In order to make the value DF of the equation (1) zero, it is necessary that delay times of the P-and N-MOS transistors are coincided, and the relations "$\tau N27 = \tau N28$", "$\tau N29 = \tau N30$", "$\tau N27 = \tau P28$", and "$\tau P29 = \tau P30$" are met. However, the P- and N-MOS transistors MP27 and MN27 are of transistor gate structure. Therefore, it is difficult that delay times of those transistors are not coincided with those of the P- and N-MOS transistors MP28 and MN28 which are of inverter structure. In addition, it is very difficult to set up the relation "$\tau P22 = 0$".

Consequently, in case where carrier mobilitis and threshold voltages of the P-and N-MOS transistors are fluctuated dependent on the fabrication conditions thereof, the relation "tpdr≠tpdf" is resulted, so that the precision of one bit D/A converter functioning as a feed-back circuit becomes deteriorated. As a result, the distortion factor of the conventional delta sigma modulator becomes deteriorated.

Next, a delta sigma modulator of a first preferred embodiment according to the invention will be explained in FIG. 2.

The delta sigma modulator comprises an integration circuit 210, a comparing circuit 215, first to fourth delay circuit 220, 225, 230 and 235, first and second latch circuits 240 and 245, first to third inverters 250, 255 and 260, and an adder circuit 265. The integration circuit 210 comprises an operational amplifier 12 having a positive input connected to a first reference voltage source 11, and a negative input connected through a first resistor $R_{11}$ of the adder circuit 265 to a signal input circuit IN, and a capacitor $C_{11}$ connected between an output of the operational amplifier 12 and the negative input thereof. The comparing circuit 215 comprises a voltage comparator 14 having a positive input connected to the output of the operational amplifier 12, and a negative input connected to a second reference voltage source 13, and a level converter 15 having an input connected to an output of the voltage comparator 14, and an output connected to a signal output terminal OUT. The first to fourth delay circuits 220, 225, 230 and 235, the first and second latch circuits 240 and 245, and the first to third inverters 250, 255 and 260 comprise P- and N-MOS transistors which are connected as shown in FIG. 2.

That is, a P-MOS transistor MP4 is connected at gate to an output of the level converter 15, and at source to a positive power supply 16, an N-MOS transistor MN14 is connected at gate to the output of the level converter 15, and at source to the negative power supply 17, a P-MOS transistor MP12 is connected at gate to a clock signal input terminal CLK, and at source to the positive power supply 16, an N-MOS transistor MN12 is connected at gate to the clock signal input terminal CLK, at source to the negative power supply 17 and at drain to drain of the P-MOS transistor MP12, a P-MOS transistor MP13 is connected at gate to drain of the P-MOS transistor MP12, and at source to the positive power supply 16, an N-MOS transistor MN13 is connected at gate to drain of the N-MOS transistor, at source to the negative power supply 17, and at drain to drain of the P-MOS transistor MP13, a P-MOS transistor MP1 is connected at gate to drain of the P-MOS transistor MP12, and at source to the positive power supply 16, an N-MOS transistor MN1 is connected at gate to drain of the P-MOS transistor MP12, at source to the negative power supply 17, and at drain to drain of the P-MOS transistor MP1, a P-MOS transistor MP2 is connected at gate to drain of the P-MOS transistor MP12, and at source to the positive power supply 16, a N-MOS transistor MN2 is connected at gate to drain of the P-MOS transistor MP12, at source to the negative power supply 17, and at drain to drain of the P-MOS transistor MP2, a P-MOS transistor MP3 is connected at gate to drain of the P-MOS transistor MP2, and at source to the positive power supply 16, an N-MOS transistor MN3 is connected at gate to drain of the P-MOS transistor MP2, at source to the negative power supply 17, and at drain to drain of the P-MOS transistor MP3, a P-MOS transistor MP5 is connected at gate to drain of the P-MOS transistor MP1, and at source to drain of the P-MOS transistor MP4, an N-MOS transistor MN5 is connected at gate to the P-MOS transistor MP3, at source to drain of the N-MOS transistor MN4, and at drain to drain of the P-MOS transistor MP5, a P-MOS transistor MP6 is connected at gate to the drain of the P-MOS transistor MP3, and at source to the positive power supply 16, an N-MOS transistor MN6 is connected at gate to drain of the P-MOS transistor MP13, at source to the negative power supply 17, and at drain to drain of the P-MOS transistor MP6, a P-MOS transistor MP7 is connected at gate to drain of the P-MOS transistor MP13, and at source to the positive power supply 16, an N-MOS transistor MN7 is connected at gate to drain of the P-MOS transistor MP13, at source to the negative power supply 17, and at drain to drain of the P-MOS transistor MP7, a P-MOS transistor MP-8 is connected at gate to drain of the P-MOS transistor MP13, and at source to the positive power supply , an N-MOS transistor MN8 is connected at gate to drain of the P-MOS transistor MP7, at source to the negative power supply, and at drain to drain of the P-MOS transistor MP8, a P-MOS transistor MP9 is connected at gate to drain of the P-MOS transistor MP5, and at source to the positive power supply 16, an N-MOS transistor MN9 is connected at gate to drain of the P-MOS transistor MP5, and at source to the negative power supply 17, a P-MOS transistor MP10 is connected at gate to drain of the P-MOS transistor MP6, and at source to drain of the P-MOS transistor MP9, an N-MOS transistor MN10 is connected at gate to drain of the P-MOS transistor MP8, at source to drain of the N-MOS transistor MN9, and at drain to drain of the P-MOS transistor MP10, a P-MOS transistor MP11 is connected at gate to drain of the P-MOS transistor MP10, at source to the positive power supply 16, and at drain to a second resistor $R_{12}$ of the adder circuit 265, and a N-MOS transistor MN11 is connected at gate to drain of the P-MOS transistor MP10, at source to the negative power supply 17, and at drain to drain of the P-MOS transistor MP11. In this P- and N-MOS transistor circuit, reference numeral 1 indicates a data input terminal, 2 a reverse phase clock input terminal, 3 a forward phase clock input terminal, and 4 a data output terminal. Finally, the adder circuit 265 comprises the first resistor $R_{11}$ connected between the signal input terminal IN and the negative input of the operational amplifier 12, and the second resistor $R_{12}$ connected between a common node of drains of the P- and N-MOS transistor MP11 and MN11 and the negative input of the operational amplifier 12.

In operation, it is assumed that data delay times of the MOS transistors MN12, MP13, MN6, MN7, MP8, MP10, MN10, MP11 and MN11 are $\tau N12$, $\tau P13$, $\tau N6$, $\tau N7$, $\tau P8$, $\tau P10$, $\tau N10$, $\tau P11$, and $\tau N11$. In this assumption, a rising delay time tpdr and a falling delay time tpdf for data at the output of the P- and N-MOS transistors MP11 and MN11 are expressed relatively to the input of the clock signal at the clock signal input terminal CLK by the equation (4) and (5).

$$tpdr = \tau N12\ \tau P13\ \tau N7\ \tau P8\ \tau N10\ \tau P11 \quad (4)$$

$$tpdf = \tau N12 + \tau P13 + \tau N6 + \tau P10 + N11 \quad (5)$$

The output of the P- and N-MOS transistors MP5 and MN5 becomes determined prior to entering a slave mode, so that the N-MOS transistor MN9 is turned on at the data-rising time. Where an ON resistance of the N-MOS transistor MN9 is set to be sufficiently small, it is assumed that a source potential of the NMOS transistor MN10 is approximately equal to a voltage value ($V_{SS}$) of the negative power supply 17. On the other hand, the P-MOS transistor MP9 is turned on at the data falling time. Consequently, it is assumed that a source potential of the P-MOS transistor mp10 is approximately equal to a voltage value ($V_{DD}$) of the positive power supply 16, where an ON resistance of the P-MOS transistor MP9 is set to be sufficiently small. In accordance with these assumptions, data delay times of the P- and N-MOS transistors MP9 and MN9 are excluded from the equations (4) and (5).

In the equations (4) and (5), the portion "$\tau N12 + \tau P13$" is common. Further, $\tau P11$ is made equal to $\tau N11 (\tau P11 = \tau N11)$ to provide the relation "tr=tf". Still further, the second latch circuit 245 composed of the P- and N-MOS transistors MP9, MP10, MN9 and MN10 provides a clocked inverter.

Therefore, it is possible to provide the relations "$\tau N10 = \tau N11$" and "$\tau P10 = \tau P11$". Here, where MOS transistors are designed to provide the relation "$\tau N7 + \tau P8 = \tau N6$", the relation "tpdr=tpdf" is obtained.

In the above transistor design, even if carrier mobilitis and threshold voltage values of the P-MOS transistors, and those of the N-MOS transistors are fluctuated dependent on fabricating conditions, the relation "tpdr≈tpdf" is obtained. In other words, even if, for instance, data delay times of the N-MOS transistors are increased by "a" times, the below equations (6) and (7) are obtained.

$$tpdr = a \cdot \tau N12 + \tau P13 + a \cdot \tau N7 + \tau P8 + a \cdot \tau N10 + \tau P11 \quad (6)$$

$$tpdf = a \cdot \tau N12 + \tau P13 + a \ \tau N6 + \tau P10 + a \cdot \tau N11 \quad (7)$$

In the above equations (6) and (7), if the relations "$\tau P8 << a \cdot N7$", "$\tau N10 = \tau P10$" and "$\tau N10 = \tau N11$" are met, the relation "tpdr≈tpdf" is obtained. Accordingly, the value |tpdr-tpdf| becomes extremely small to increase the mass-productivity of delta sigma modulators.

Figure 2:
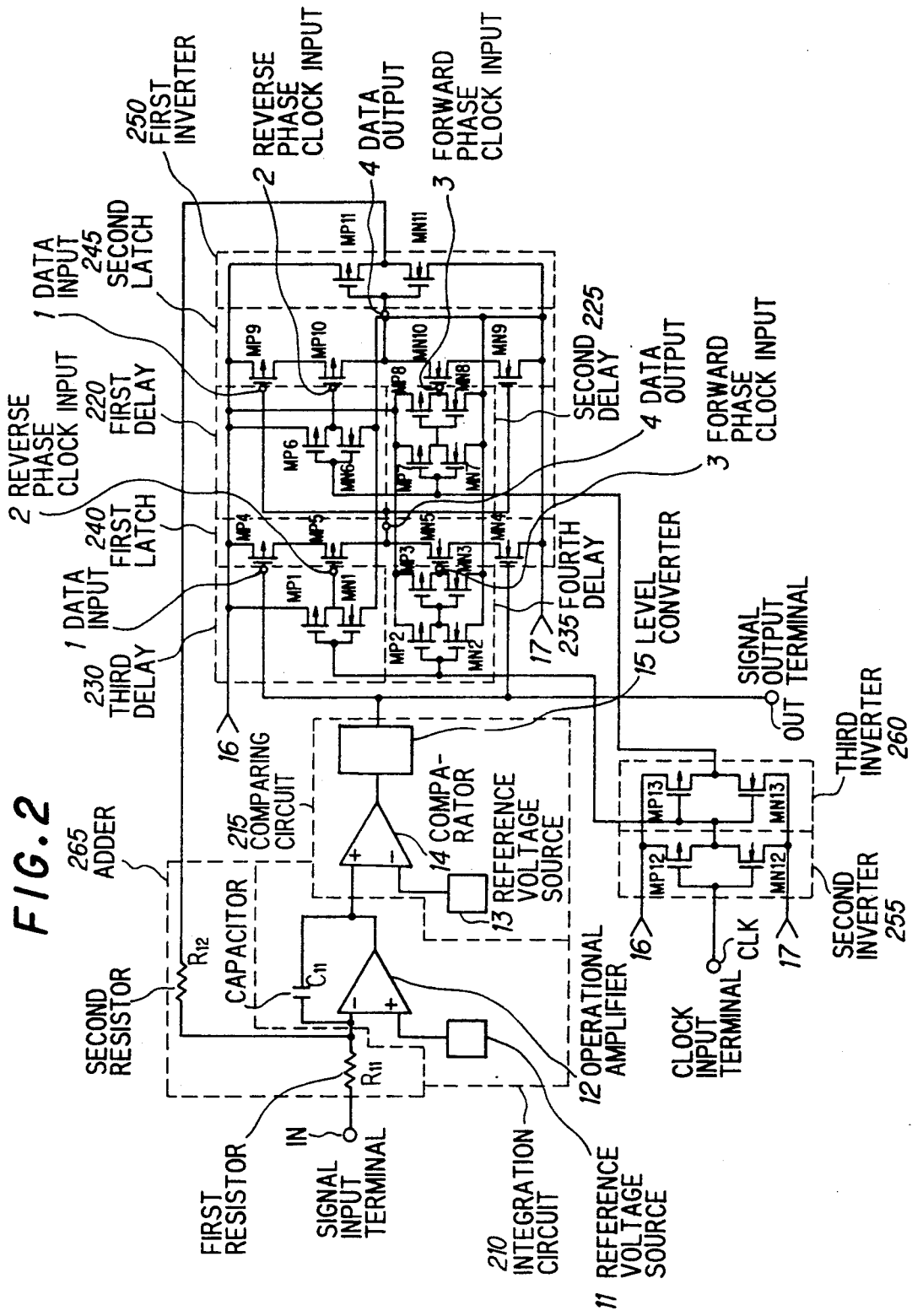
FIGS. 2 and 3 are circuit diagrams showing delta sigma modulators of first and second preferred embodiments according to the invention.
Figure 3:
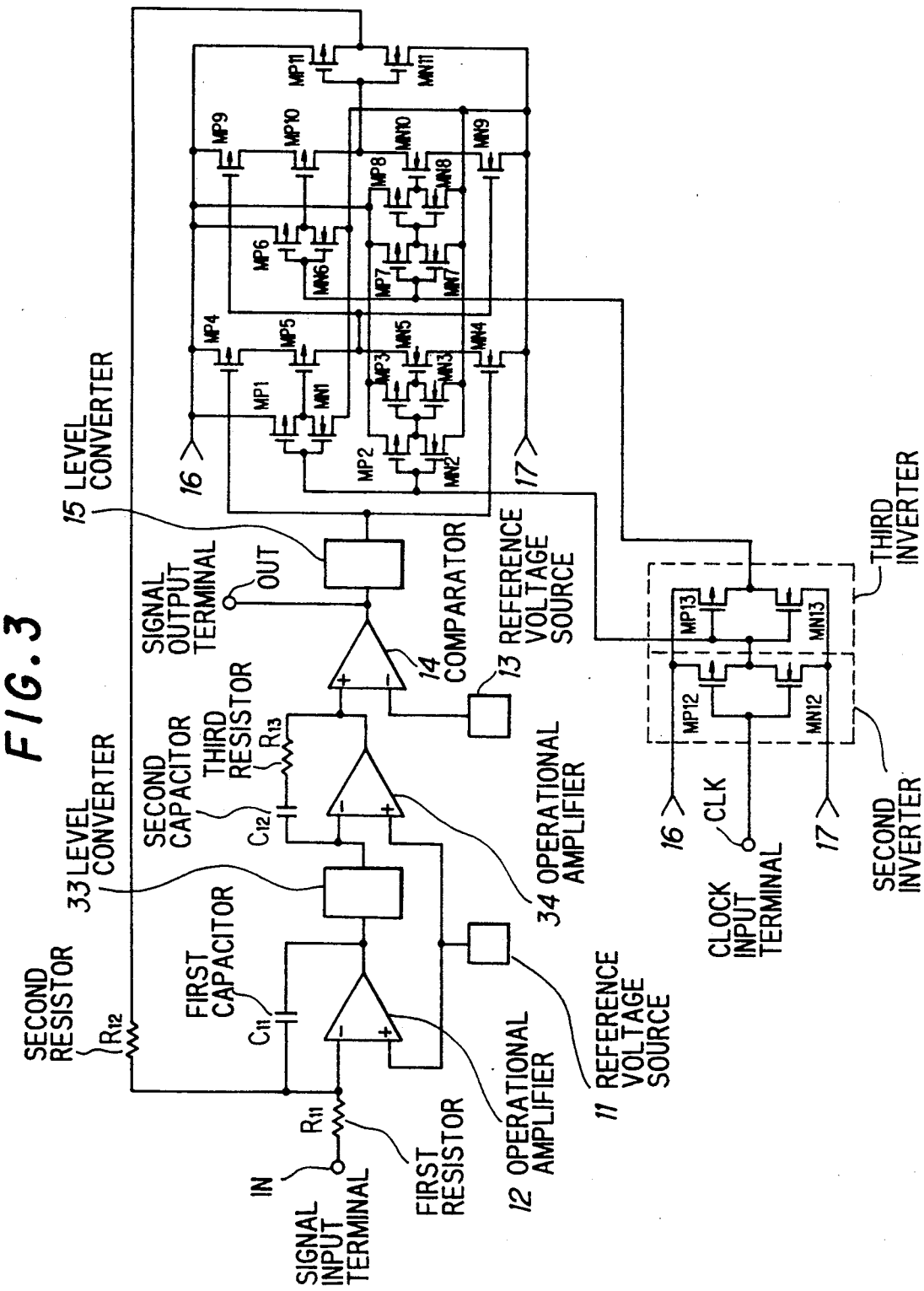

FIG. 3 shows a delta sigma modulator of a second preferred embodiment according to the invention, wherein like parts are indicated by like reference numerals as used in FIG. 2.

In the second preferred embodiment, a level converter 33 and an operational amplifier 34 are additionally provided, wherein the operational amplifier 34 has a positive input connected to the first reference voltage source 11 and a negative input connected to an output of the level converter 33. In addition, a second capacitor $C_{12}$ and a third resistor $R_{13}$ are connected between an output of the operational amplifier 34 and the negative input thereof.

In the second preferred embodiment, the operational amplifier 34 is added to provide a quadratic delta sigma modulator, so that a lower sampling frequency can be used to provide a predetermined distortion factor. As compared to the first preferred embodiment, the restriction of the equation (1) can be relieved to further increase the mass-productivity of delta sigma modulators.

Although the invention has been described with respect to specific embodiment for complete and clear disclosure, the appended claims are not to thus limited and alternative constructions that may occur to one skilled in the art which fairly fall within the basic teaching herein set forth.

What is claimed is:

1. A delta sigma modulator, comprising:
   an adder for adding an input signal and a signal which is fed back in accordance with said input signal;
   an integration circuit for integrating an output signal of said adder;
   a comparator circuit for comparing an output signal of said integration circuit and a reference signal;
   a first latch circuit having data input and output terminals and forward and reverse phase clock input terminals;
   a second latch circuit having data input and output terminals and forward and reverse phase clock input terminals;
   first to third inverters; and
   first to fourth delay circuits; wherein:
   an output of said adder is connected to an input of said integration circuit; an output of said integration circuit is connected to said comparator circuit; an output of said comparator circuit is connected to a signal output terminal and said data input terminal of said first latch circuit; said data output terminal of said first latch circuit is connected to said data input terminal of said second latch circuit; said data output terminal of said second latch circuit is connected to an input of said first inverter; an output of said first inverter is connected to an input of said adder; an input of said second inverter is connected to a clock input terminal and an output thereof is connected to inputs of said third inverter and said third and fourth delay circuits; an output of said third inverter is connected to inputs of said first and second delay circuits; an inverted output of said first delay circuit is connected to said reverse phase clock input terminal of said second latch circuit; an output of said second delay circuit is connected to said forward phase clock input terminal of said second latch circuit; an inverted output of said third delay circuit is connected to said reverse phase clock input terminal of said first latch circuit; and an output of said fourth delay circuit is connected to said forward phase clock input terminal of said first latch circuit.

2. A, delta sigma modulator, according to claim 1, wherein:
   said adder comprises first and second resistors, said first resistor being connected between an output thereof and said signal input terminal, and said second resistor being connected between said output thereof and said output of said first inverter.

3. A delta sigma modulator, according to claim 1, wherein:
   said integration circuit comprises a first operational amplifier, a first reference voltage source, and a first capacitor, an input thereof being connected to a negative input of said first operational amplifier, said first reference voltage source being connected to a positive input thereof, said first capacitor being connected between said negative input and an output of said first operational amplifier, and said output of said operational amplifier being an output of said integration circuit.

4. A delta sigma modulator, according to claim 1, wherein:
   said comparator circuit comprises a voltage comparator, a second reference voltage source, and a first level converter, an input of said comparator circuit being connected to a positive input of said voltage comparator, said second reference voltage source being connected to a negative input of said voltage comparator, an output of said voltage comparator being connected to an output of said first level converter, and an output of said first level converter being an output of said comparator circuit.

5. A delta sigma modulator, according to claim 1, wherein:

said first latch circuit comprises a first P-MOS transistor connected at gate to said data input terminal, and at source to a first power supply, a first N-MOS transistor connected at gate to said data input terminal, and at source to a second power supply, a second P-MOS transistor connected at gate to said reverse phase clock input terminal, and at source to drain of said first P-MOS transistor, and a second N-MOS transistor connected at gate to said forward phase clock input terminal, at source to drain of said first N-MOS transistor, and at drain to drain of said second P-MOS transistor, said drain of said second P-MOS transistor being said output of said first latch circuit.

6. A delta sigma modulator, according to claim 1, wherein:

said second latch circuit comprises a third P-MOS transistor connected at gate to said data input terminal, and at source to said first power supply, a third N-MOS transistor connected at gate to said data input terminal, and at source to said second power supply, a fourth P-MOS transistor connected at gate to said reverse phase clock input terminal, and at source to said drain of said third P-MOS transistor, and a fourth N-MOS transistor connected at gate to said forward phase clock input terminal, at source to said drain of said third N-MOS transistor, and at said drain of said fourth P-MOS transistor being said output of said second latch circuit.

7. A delta sigma modulator, according to claim 1, wherein;

said first inverter comprises a fifth P-MOS transistor connected at source to said first power supply, and a fifth N-MOS transistor connected at gate to gate of said fifth P-MOS transistor, at source to said second power supply, and at drain to drain of said fifth P-MOS transistor, said gate of said fifth P-MOS transistor being said input of said first inverter, and said drain of said fifth P-MOS transistor being said output thereof.

8. A, delta sigma modulator, according to claim 1, wherein:

said second inverter comprises a sixth P-MOS transistor connected at source to said first power supply, and a sixth N-MOS transistor connected at gate to gate of said sixth P-MOS transistor, at source to said second power supply, and at drain to drain of said sixth -MOS transistor, said gate of said sixth P-MOS transistor being said input of said second inverter, and said drain of said sixth P-MOS transistor being said output of said second inverter.

9. A delta sigma modulator, according to claim 1, wherein:

said third inverter comprises a seventh P-MOS transistor connected at source to said first power supply, and a seventh N-MOS transistor connected at gate to gate of said seventh P-MOS transistor, at source to said second power supply, and at drain to drain of said seventh P-MOS transistor, said gate of said seventh P-MOS transistor being said input of said third inverter, and said drain of said seventh P-MOS transistor being said output thereof.

10. A delta sigma modulator, according to claim 1, wherein:

said first delay circuit comprises an eighth P-MOS transistor connected at source to said first power supply, and an eighth N-MOS transistor connected at gate to gate of said eighth P-MOS transistor, at source to said second power supply, and at drain to drain of said eighth P-MOS transistor, said gate of said eighth P-MOS transistor being said input of said first delay circuit, and said drain of said eighth P-MOS transistor being said output thereof.

11. A delta sigma modulator, according to claim 1, wherein:

said second delay circuit comprises a ninth P-MOS transistor connected at source to said first power supply, and a ninth N-MOS transistor connected at source to said second power supply, at gate to gate of said ninth P-MOS transistor, and at drain to drain of said ninth P-MOS transistor, a tenth P-MOS transistor connected at source to said first power supply, and at gate to drain of said ninth P-MOS transistor, and a tenth N-MOS transistor connected at source to said second power supply, at gate to drain of said ninth P-MOS transistor, and at drain to drain of said tenth P-MOS transistor, said gate of said ninth P-MOS transistor being said input of said second delay circuit, and said drain of said tenth P-MOS transistor being said output thereof.

12. A delta sigma modulator, according to claim 1, wherein:

said third delay circuit comprises an eleventh P-MOS transistor connected at source to said first power supply, and a eleventh N-MOS transistor connected at gate to gate of said eleventh P-MOS transistor, at source to said second power supply, and at drain to drain of said eleventh P-MOS transistor, said gate of said eleventh P-MOS transistor being said input of said third delay circuit, and said drain of said eleventh P-MOS transistor being said output thereof.

13. A delta sigma modulator, according to claim 1, wherein:

said fourth delay circuit comprises a twelfth P-MOS transistor connected at source to said first power supply, a twelfth N-MOS transistor connected at source to said second power supply, at gate to gate of said twelfth P-MOS transistor, and at drain to drain of said twelfth P-MOS transistor, a thirteenth P-MOS transistor connected at source to said first power supply, and at gate to drain of said twelfth P-MOS transistor, and a thirteenth N-MOS transistor connected at source to said second power supply, at gate to drain of said twelfth P-MOS transistor, and at drain to drain of said thirteenth P-MOS transistor, said gate of said twelfth P-MOS transistor being said input of said fourth delay circuit, and said drain of said thirteenth P-MOS transistor being said output thereof.

14. A delta sigma modulator, according to claim 3, further comprising:

a second operational amplifier; a second capacitor; and a third resistor; wherein:

said second operational amplifier has a positive input connected to said first reference voltage source, a negative input connected to said output of said first operational amplifier, and an output connected to said input of said comparator circuit and fed back via second capacitor and said third resistor to said negative input thereof.

* * * * *

UNITED STATES PATENT AND TRADEMARK OFFICE
CERTIFICATE OF CORRECTION

PATENT NO. : 5,214,431
DATED : May 25, 1993
INVENTOR(S) : Naoto Oikawa

It is certified that error appears in the above-identified patent and that said Letters Patent is hereby corrected as shown below:

Claim 2, col. 8, line 38, delete "," (first occurrence).

Claim 4, col. 8, line 66, change "output" to --input--.

Claim 6, col. 9, line 31, change "said drain" to --drain to said drain of said fourth N-MOS transistor, said drain--.

Claim 7, col. 9, line 35, change ";" to --:--.

Claim 8, col. 9, line 45, delete "," (first occurrence);

Claim 8, col. 9, line 52, change "-MOS" to --P-MOS--.

Signed and Sealed this

Eleventh Day of January, 1994

Attest:

BRUCE LEHMAN

Attesting Officer

Commissioner of Patents and Trademarks